United States Patent
Tu

(10) Patent No.: US 8,871,604 B2
(45) Date of Patent: Oct. 28, 2014

(54) METHODS OF MANUFACTURING SEMICONDUCTOR DEVICES THAT INCLUDE FORMING A CAPACITOR USING A CAP LAYER

(75) Inventor: Kuo-Chi Tu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 66 days.

(21) Appl. No.: 13/363,293

(22) Filed: Jan. 31, 2012

(65) Prior Publication Data

US 2013/0193555 A1   Aug. 1, 2013

(51) Int. Cl.
*H01L 21/027* (2006.01)
(52) U.S. Cl.
USPC .................................. 438/386; 257/E21.019
(58) Field of Classification Search
USPC .................................................... 257/E29.346
See application file for complete search history.

(56) References Cited

U.S. PATENT DOCUMENTS

| | | | |
|---|---|---|---|
| 6,833,578 B1 * | 12/2004 | Tu et al. | 257/301 |
| 7,262,452 B2 * | 8/2007 | Chae | 257/301 |
| 7,382,012 B2 | 6/2008 | Tu et al. | |
| 7,557,399 B2 | 7/2009 | Tu et al. | |
| 7,666,737 B2 | 2/2010 | Tu | |
| 7,745,865 B2 | 6/2010 | Tu | |
| 2006/0292816 A1 * | 12/2006 | Mikawa et al. | 438/396 |
| 2007/0210365 A1 * | 9/2007 | Togashi et al. | 257/296 |

* cited by examiner

*Primary Examiner* — Stephen W Smoot
(74) *Attorney, Agent, or Firm* — Slater and Matsil, L.L.P.

(57) ABSTRACT

Semiconductor devices and methods of manufacture thereof are disclosed. In one embodiment, a method of manufacturing a semiconductor device includes forming a capacitor within a trench in a workpiece, the capacitor comprising a bottom electrode, a dielectric layer disposed over the bottom electrode, and a top electrode disposed over the dielectric layer. A cap layer is formed over the capacitor. Forming the capacitor and forming the cap layer comprise optimizing at least one of: a width of the trench, a thickness of the bottom electrode, a thickness of the dielectric layer, a thickness of the top electrode, and a thickness of the cap layer, so that the cap layer completely covers the top electrode.

20 Claims, 15 Drawing Sheets

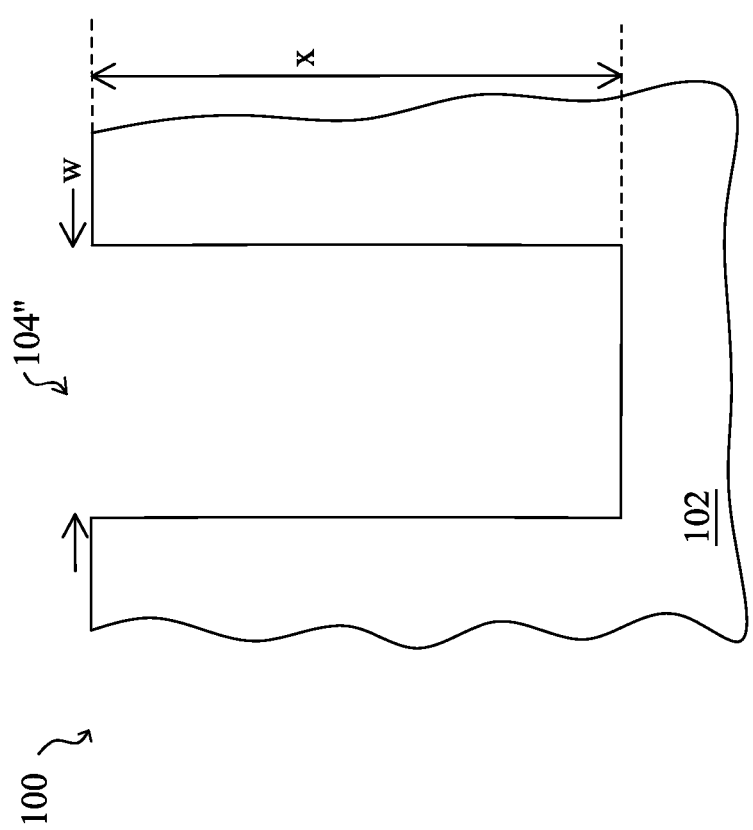

METHODS OF MANUFACTURING SEMICONDUCTOR DEVICES THAT INCLUDE FORMING A CAPACITOR USING A CAP LAYER

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

Capacitors are elements that are used extensively in semiconductor devices for storing an electrical charge. Capacitors essentially comprise two conductive plates separated by an insulating material. Capacitors are used in applications such as electronic filters, analog-to-digital converters, memory devices, control applications, and many other types of semiconductor device applications.

The semiconductor industry continues to improve the integration density of various electronic components (e.g., transistors, diodes, resistors, capacitors, etc.) by continual reductions in minimum feature size, which allow more components to be integrated into a given area. As feature sizes of semiconductor devices are diminished, the manufacturing processes for capacitors and other components can become more challenging.

BRIEF DESCRIPTION OF THE DRAWINGS

For a more complete understanding of the present disclosure, and the advantages thereof, reference is now made to the following descriptions taken in conjunction with the accompanying drawings, in which:

FIGS. 1A, 1B, and 1C show cross-sectional views of a variety of trench shapes for capacitors;

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Embodiments of the present disclosure are related to manufacturing processes for semiconductor devices, and more particularly to the formation of capacitors. Novel semiconductor devices and methods of manufacture thereof will be described.

Figure 1A:
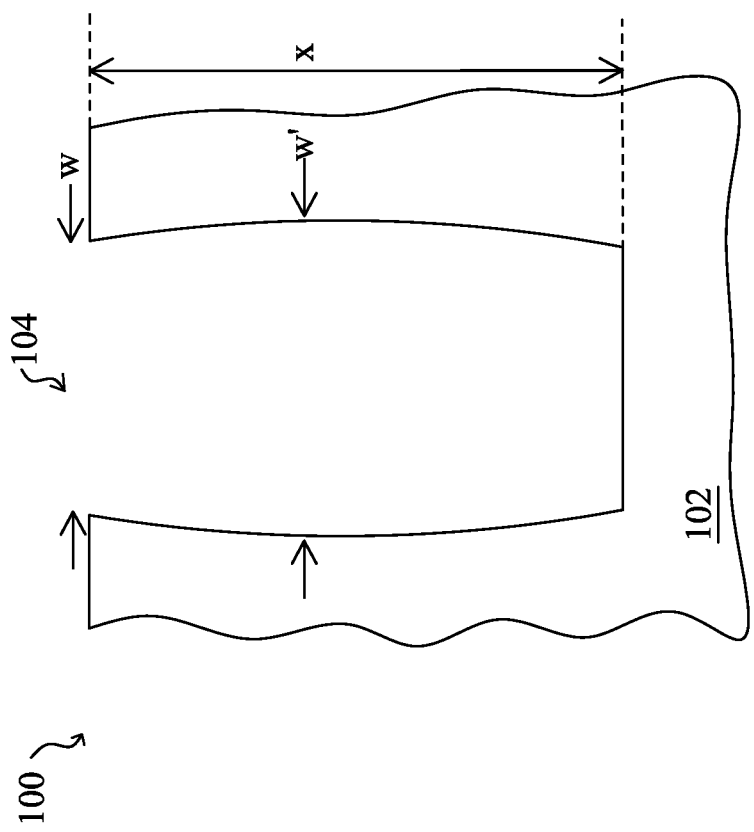
Figure 1B:
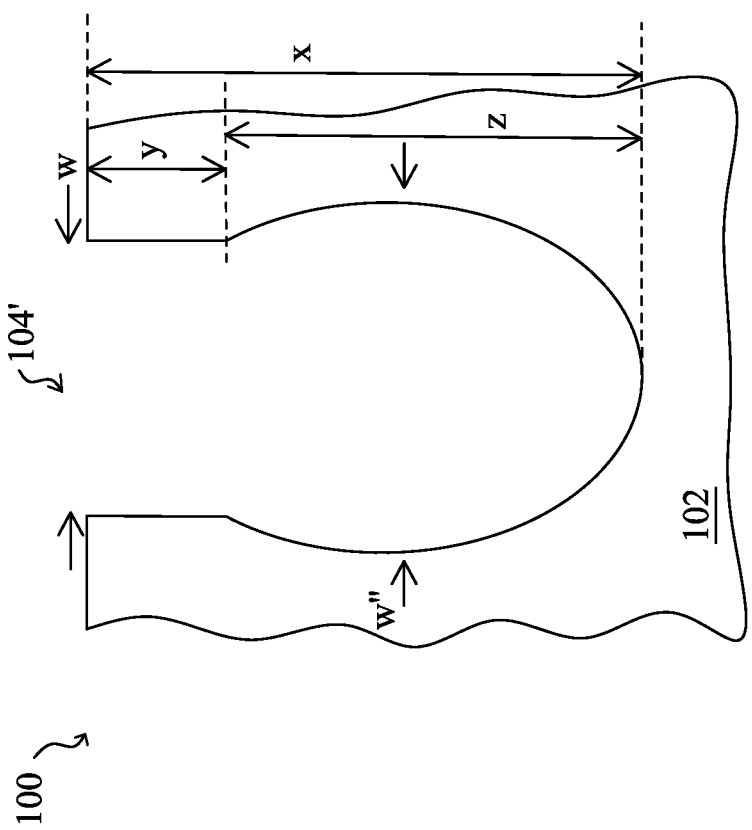
Figure 2:
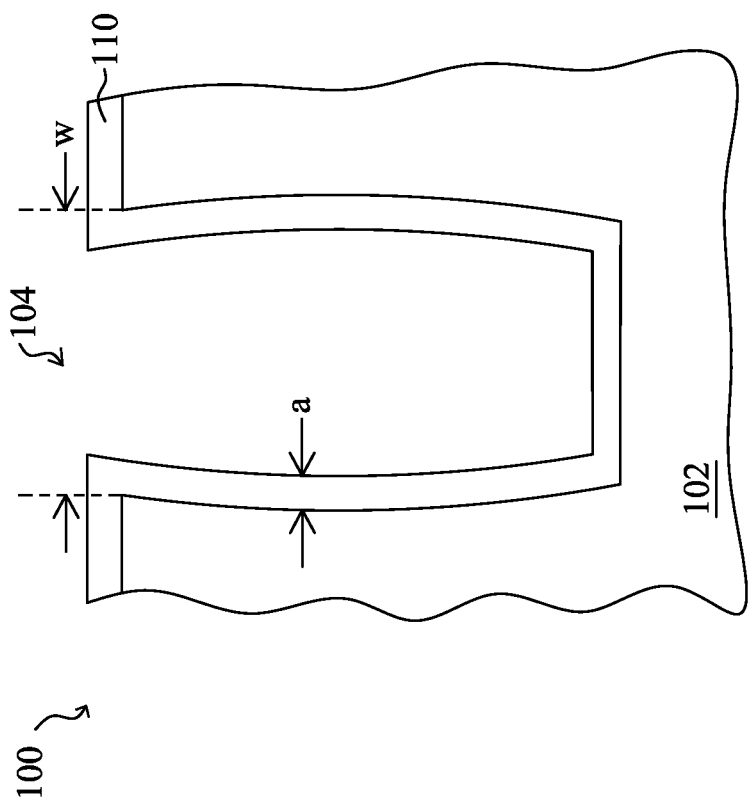
FIGS. 2 through 8 are cross-sectional views of a method of manufacturing a capacitor in a slightly bowed trench at various stages of manufacturing in accordance with an embodiment of the present disclosure.

Deep trench capacitors 130 (see FIG. 8) of semiconductor devices 100 are formed using novel methods in accordance with embodiments. FIGS. 1A, 1B, and 1C show cross-sectional views of a variety of trench 104, 104', and 104" shapes, respectively, for capacitors in accordance with embodiments of the present disclosure. FIGS. 1A and 1B illustrate embodiments wherein the trenches 104 and 104', respectively, bow outwardly beneath an opening in a top surface of a workpiece 102. FIG. 1C shows an embodiment wherein sidewalls of the trench 104" are substantially straight in a vertical direction within the workpiece 102.

Referring first to FIG. 1A, to fabricate the capacitors, a workpiece 102 is provided. The workpiece 102 may include a semiconductor substrate comprising silicon or other semiconductor materials and may be covered by an insulating layer, for example. The workpiece 102 may also include other active components or circuits, not shown. The workpiece 102 may comprise silicon oxide over single-crystal silicon, for example. The workpiece 102 may include other conductive layers or other semiconductor elements, e.g., transistors, diodes, etc. Compound semiconductors, GaAs, InP, Si/Ge, or SiC, as examples, may be used in place of silicon. The workpiece 102 may comprise a silicon-on-insulator (SOI) or a germanium-on-insulator (GOI) substrate, as examples.

A plurality of trenches 104 is formed in the workpiece 102 using lithography, e.g., by depositing a photoresist, patterning the photoresist, and using the photoresist as an etch mask while top portions of the workpiece 102 are etched away, leaving the trench 104 shown in FIG. 1A. The trenches 104 may be formed using other methods. Only one trench 104 (and trenches 104' and 104", to be described further herein) is shown in FIGS. 1 through 12; however, a plurality of trenches 104 may be formed across a top surface of the workpiece 102, the number depending on the application of the semiconductor device 100. The trench 104 may comprise a variety of shapes, depending on many factors, such as the crystalline structure of the workpiece 102 and/or the chemistries, temperature, or duration of the etch process used to form the trench 104, as examples.

In FIG. 1A, a slightly bowed trench 104 is shown having a smaller width w proximate the opening of the trench 104 in the top surface of the workpiece 102 than a width w' at a lower region of the trench 104. The width w' may be greater than width w by a few nm. Width w may comprise about 0.1 μm or less, and may comprise about 0.07 μm in some embodiments, as examples. The trench 104 may have a depth x extending vertically into the workpiece 102 of about 1 μm or less, for example. The depth x of the trench 104 may comprise about 0.6 μm, as another example. Alternatively, widths w and w' and depth x may comprise other dimensions.

FIG. 1B shows another example of a shape of a trench 104' in accordance with other embodiments of the present disclosure. The trench 104' comprises a bottle-shape, being more bowed than the trench 104 shown in FIG. 1A. The width w of the opening at the top surface of the workpiece 102 and the depth x of the trench 104' may comprise similar dimensions described for FIG. 1A. The trench 104' may comprise a width w" in a lower portion that is greater than the width w of the opening of the trench 104' by several 10s or 100s of nm, for example. The trench 104' may comprise substantially the same width w as the opening of the trench 104' below the top surface of the workpiece 102 for a distance y within the top surface of the workpiece 102, wherein y may comprise about 10 to 50 nm, as an example. The remainder of the trench 104' in the lower portion comprises the bowed shape that extends further into the workpiece 102 in a vertical direction by a distance z, which may comprise several hundred nm. The bowed lower part of the trench 104' may comprise a rounded or circular shape in the cross-sectional view, as shown. Alternatively, dimensions w", y, and z may comprise other values.

The bowed trenches 104 and 104' shown in FIGS. 1A and 1B may be formed using etch processes that include one or more anisotropic components, so that a portion of the workpiece 102 material is removed inside the trench 104 or 104' from beneath the opening at the top surface of the workpiece 102, forming the bowed shape, for example. Alternatively, the bowed trenches 104 and 104' may be formed using other methods.

FIG. 1C shows another possible shape of a trench 104" in accordance with an embodiment. Sidewalls of the trench 104" are substantially straight in a vertical direction within the workpiece 102. Width w and depth x of the trench 104" may comprise similar dimensions described for FIG. 1A. The trench 104" may be formed using a substantially isotropic etch process in some embodiments, to form the substantially vertical sidewalls, although alternatively, the trench 104" may be formed using other methods.

FIGS. 2 through 8 are cross-sectional views of a method of manufacturing a capacitor 130 in a slightly bowed trench 104 at various stages of manufacturing in accordance with an embodiment of the present disclosure. After forming the trench 104 in the workpiece 102 as described for FIG. 1A, a bottom electrode 110 material is formed over the workpiece 102, a shown in FIG. 2. The bottom electrode 110 material lines the top surfaces of the workpiece 102 and the sidewalls and the bottom surface of the trench 104. The bottom electrode 110 material comprises a layer of conductive material, such as Cu, Al, TiN, TaN, ruthenium, other conductive materials, or combinations or multiple layers thereof. The bottom electrode 110 material may be formed by chemical vapor deposition (CVD) or other processes, and may comprise a thickness comprising dimension a of about 500 Angstroms or less in some embodiments. The bottom electrode 110 material may comprise a thickness comprising dimension a of about 50 to 450 Angstroms in other embodiments. Alternatively, the bottom electrode 110 material may comprise other materials and dimensions, and may be formed using other methods.

Figure 3:
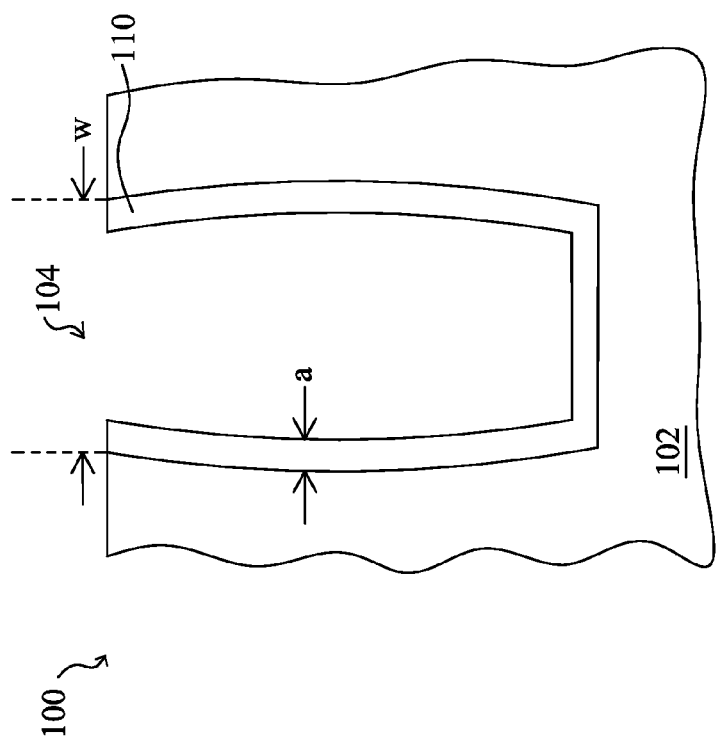

After the bottom electrode 110 material is formed, the excess bottom electrode 110 material on the top surface of the workpiece 102 is removed by a chemical-mechanical polishing (CMP) process, an etch-back process, or a combination thereof, as examples. As a result, a bottom electrode 110 is formed that lines the trench 104, as illustrated in FIG. 3.

Figure 4:
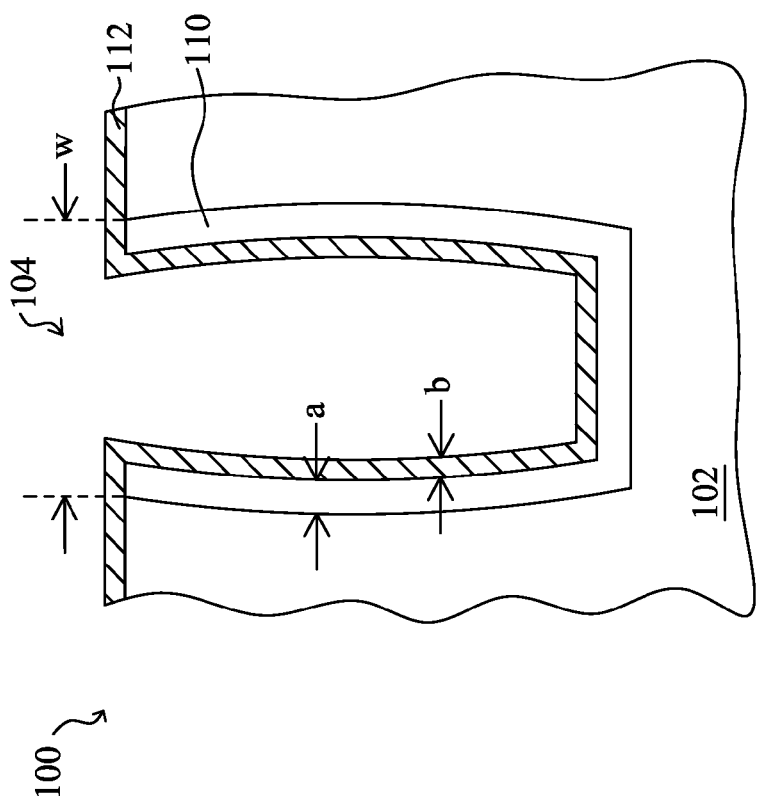

A dielectric layer 112 is formed over the workpiece 102, as shown in FIG. 4. The dielectric layer 112 lines the top surface of the workpiece 102 and lines the bottom electrode 110 on the sidewalls and bottom surface of the trench 104. The dielectric layer 112 may comprise a high dielectric constant (K) dielectric film, such as $Ta_2O_5$, $Al_2O_3$, $HFO_2$, $(BaSr)TiO_3$ (BST), $(Pb,Zr)TiO_3$ (PZT), other multi-layer high-K dielectric materials, an oxide, a nitride, or the like, or combinations or multiple layers thereof, as examples. The dielectric layer 112 may be formed by CVD techniques and may comprise a thickness comprising dimension b of about 500 Angstroms of less. In some embodiments, the dielectric layer 112 comprises a thickness of about 10 to 400 Angstroms. Alternatively, the dielectric layer 112 may comprise other materials and dimensions, and may be formed using other methods.

Figure 5:
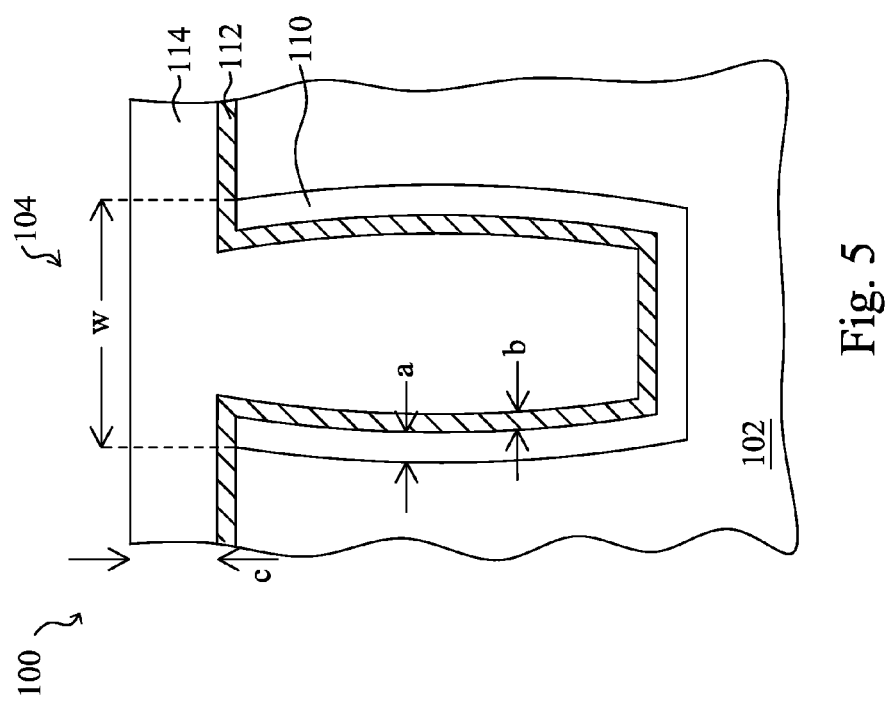

Next, a top electrode 114 material is formed over the dielectric layer 112, as shown in FIG. 5. The top electrode 114 material may comprise similar materials and may be formed using similar deposition methods as described for the bottom electrode 110 material. In some embodiments, the top electrode 114 material may comprise about the same thickness comprising dimension c as the thickness comprising dimension a of the bottom electrode 110. Alternatively, the top electrode 114 material may comprise a greater thickness c than the bottom electrode 110 thickness a, as shown in FIG. 5. The top electrode 114 material may comprise a thickness comprising dimension c of about 50 to 5,000 Angstroms in some embodiments, although alternatively, the top electrode 114 material may comprise other materials and dimensions, and may be formed using other methods. The top electrode 114 material substantially fills an inner region of the trench 104, as shown.

Figure 6:
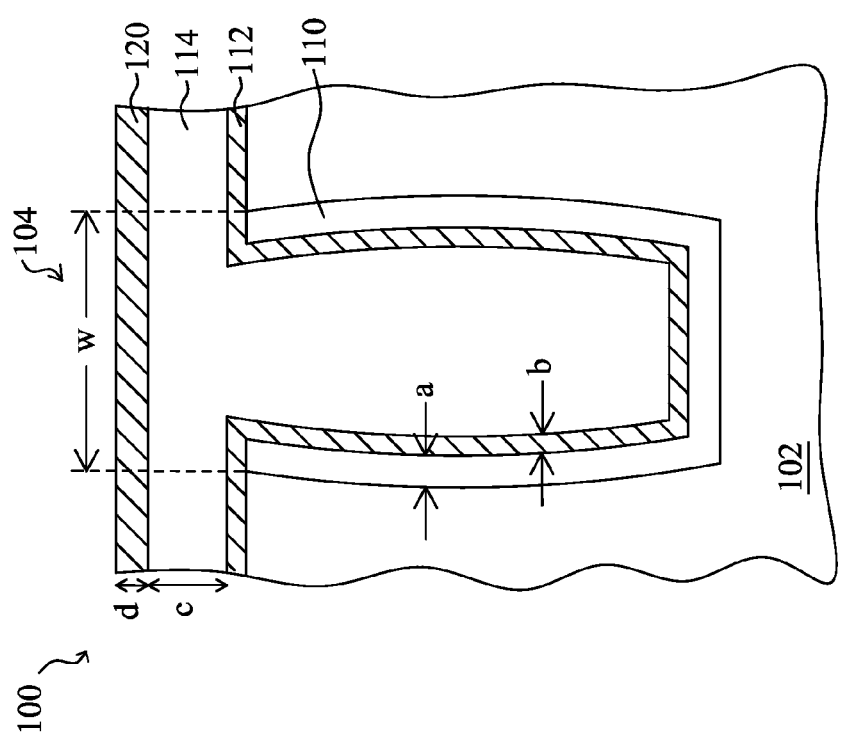

After the dielectric layer 112 and the top electrode 114 material are formed, a cap layer 120 is formed over the top electrode 114 material, as shown in FIG. 6. The cap layer 120 comprises a continuous material layer that completely covers the top electrode 114 material. The cap layer 120 comprises a material that is adapted to protect the underlying material layers, e.g., the top electrode 112 material, the dielectric layer 112, the bottom electrode 110, and the workpiece 102 during subsequent processing steps, such as the lithography processes used to pattern the top electrode 112 material and the dielectric layer 110 for form a capacitor. The cap layer may comprise SiON, $SiO_2$, or $Si_xN_y$, as examples, formed by CVD. The cap layer 120 may comprise a thickness comprising dimension d of about 1,000 Angstroms or less, for example, and in some embodiments, the cap layer 120 may comprise a thickness comprising dimension d of about 20 to 850 Angstroms. The cap layer 120 may comprise a thickness of about 20 Angstroms or greater in other embodiments. Alternatively, the cap layer 120 may comprise other materials and dimensions, and may be formed using other methods. The cap layer 120 may comprise a material layer that is also adapted to function as an anti-reflective coating (ARC) material for a subsequently-deposited layer of photoresist 122 (see FIG. 7), in some embodiments.

In some embodiments, the cap layer 120 is formed by plasma enhanced CVD (PECVD). Parameters of the PECVD process, such as the gases, ratios, power and/or temperature, may be adjusted or selected to achieve a desired Equation 1, 2, or 5 (to be described further herein) for optimizing the cap layer 120 formation in some embodiments, for example. As one example, the cap layer 120 may comprise a SiON film formed by PECVD using $N_2O$ and $SiH_4$ gases and a flow ratio range between about 5 to 20, a radio frequency (RF) power of about 50 to 150 Watts, and a reaction temperature of about 350 to 500 degrees C. These parameters of the PECVD process may be adjusted during the deposition process for the cap layer 120, for example, to achieve the desired coverage. In other embodiments, the cap layer 120 may be formed by atomic layer deposition (ALD), as another example. The cap layer 120 may alternatively be formed using other methods.

In the embodiment shown in FIGS. 2 through 8, the deposition process used to form the cap layer 120 may be non-conformal. In other embodiments, the deposition process for the cap layer 120 formation may be conformal, to be described further herein.

Figure 7:
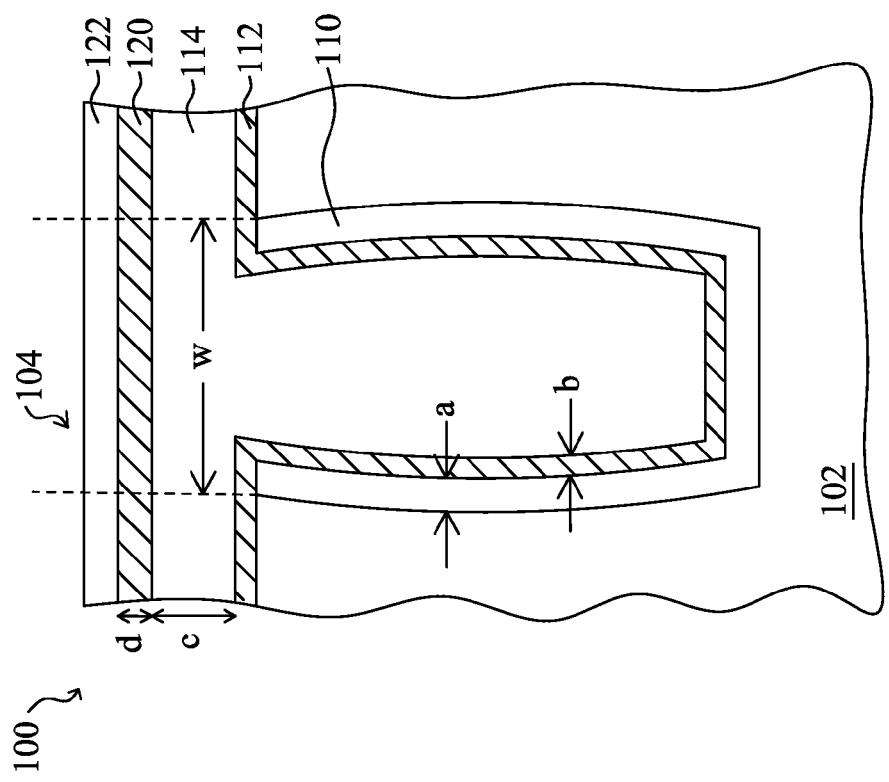

The cap layer 120, the top electrode 114 material, and the dielectric layer 112 are patterned, by depositing a layer of photoresist 122 over the cap layer 120, as shown in FIG. 7. The layer of photoresist 122 is patterned using lithography, and the layer of photoresist 122 is used as an etch mask while portions of the cap layer 120, the top electrode 114 material, and the dielectric layer 112 are etched away, leaving the structure shown in FIG. 8. The top electrode 114, dielectric layer 112, and bottom electrode 110 form a capacitor 130 that is disposed within and over the trench 104.

The manufacturing process for the semiconductor device 100 is then continued. For example, other devices may be formed within and/or over the workpiece 102, e.g., over the capacitor 130 or laterally with respect to the capacitor 130 in some embodiments. One or more insulating and/or conductive material layers may be formed over the capacitor 130 and workpiece 102. Contacts or vias (not shown) may be formed within one or more insulating material layers disposed over the capacitor 130 to make electrical contact to the bottom electrode 110 and/or top electrode 114, for example. The cap layer 120 may be left remaining in the structure, or the cap layer 120 may be removed before further processing of the semiconductor device 100, in some applications.

The capacitor 130 may be implemented in a memory device, a storage device, a soft error rate (SER) protection or robustness circuit, a logic circuit, an analog circuit, a filter, an analog-to-digital converter, a control circuit, a voltage regulator, a delay circuit, a storage enhancement circuit, or a support circuit, as examples. In some embodiments, the capacitor 130 may be utilized in a dynamic random access memory (DRAM) cell, for example. Embodiments of the present disclosure may be particularly beneficial in some embedded DRAM applications, for example, which often utilize very deep trenches 104, 104', or 104" with high aspect ratios. Alternatively, the capacitor 130 may be used in other applications.

In accordance with embodiments, forming the capacitor 130 and forming the cap layer 120 comprise optimizing at least one of: the width w of the trench 104, the thickness a of the bottom electrode 110, the thickness b of the dielectric layer 112, the thickness c of the top electrode 114, and/or the thickness d of the cap layer 120, so that the cap layer 120 completely covers the top electrode 114, providing continuous coverage with improved step coverage. One or more of the five parameters w, a, b, c, and d may be altered to optimize the cap layer 120 coverage, e.g., combinations of the parameters comprising width w and thicknesses a, b, c, and d may be altered to achieve the improved coverage and step coverage of the cap layer 130 in accordance with embodiments.

In the embodiment shown in FIGS. 2 through 8, the cap layer 120 material deposition process is non-conformal, and the trench 104 comprises a very deep and slightly bowed trench. Under these conditions, in accordance with embodiments, Equation 1 may be used to optimize the cap layer 120 formation by optimizing variables w, a, b, and c:

$$w<2\times(a+b+c); \qquad \text{Eq. 1}$$

wherein w is the width of the trench 104 (e.g., the width w of the trench 104 opening at the top surface of the workpiece 102), a is the thickness of the bottom electrode 110, b is the thickness of the dielectric layer 112, and c is the thickness of the top electrode 114. If one or more of the parameters w, a, b, or c are fixed and cannot be altered (e.g., to meet the operating characteristics of the capacitor 130, deposition process or lithography limitations, etc.), then one or more of the other parameters w, a, b, or c may be altered so that Equation 1 is met. The parameters of the width w and thicknesses a, b, and c may be altered iteratively, or by using a spreadsheet or an algorithm, as examples.

Figure 8:
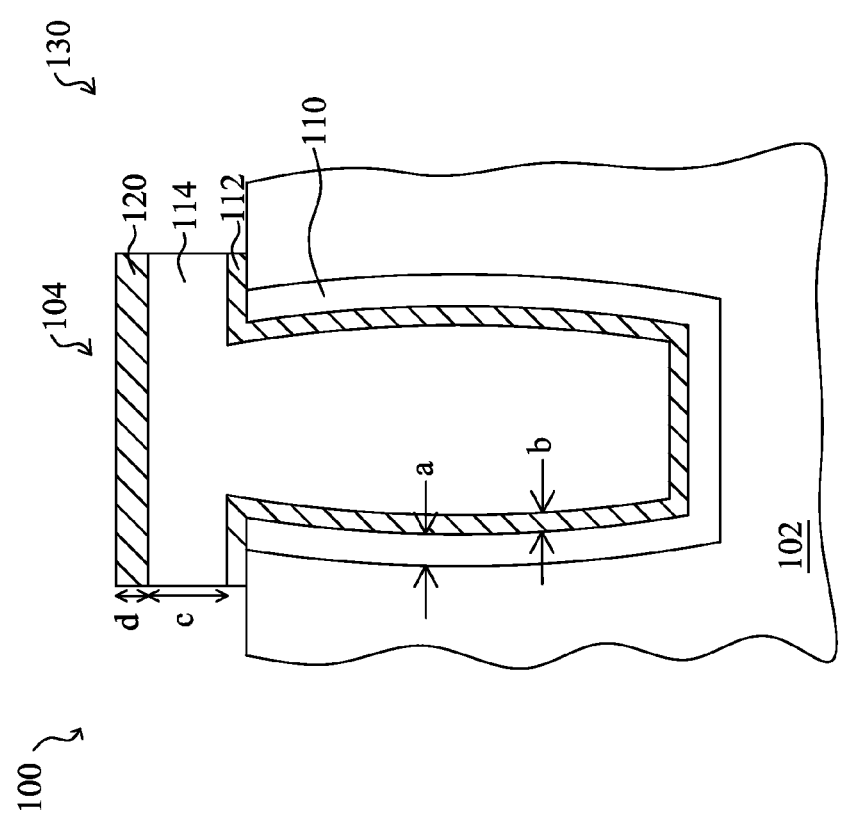
Figure 9:
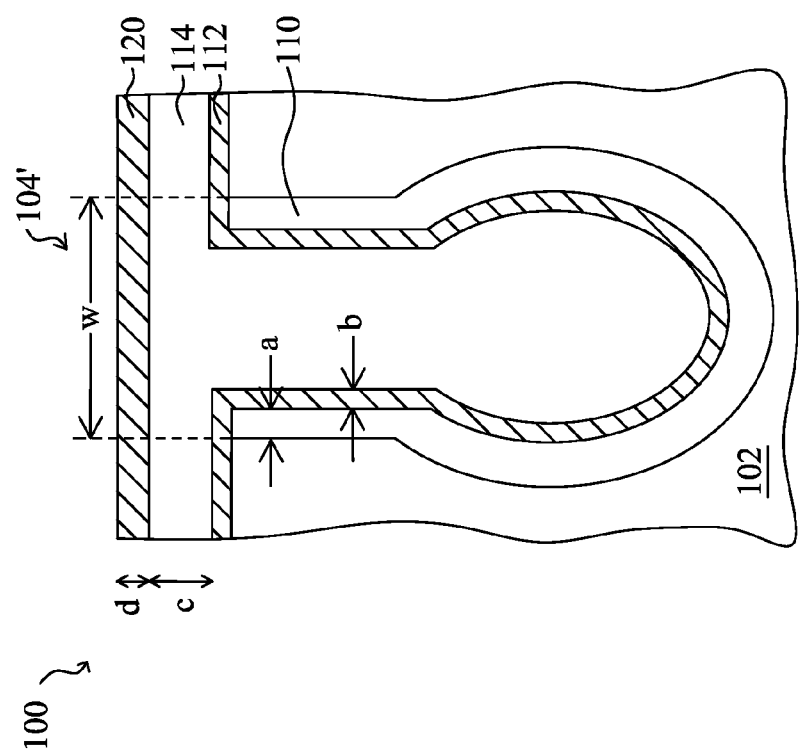
FIG. 9 illustrates a cross-sectional view of an embodiment implemented in a trench that is bowed in a bottle-shape.
Figure 10:
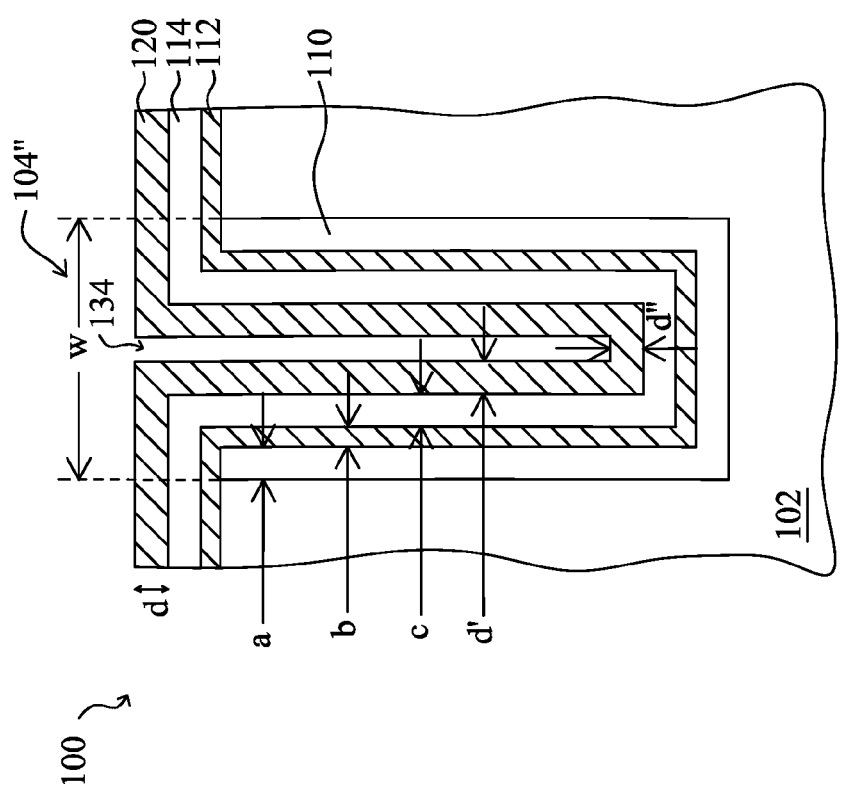
FIG. 10 illustrates a cross-sectional view of an embodiment implemented in a trench wherein the trench sidewalls are substantially vertical.

The manufacturing process described for FIGS. 2 through 8 may also be used to form capacitors 130 in other shapes of trenches. For example, FIG. 9 shows a bottle-shaped trench 104' (such as trench 104' shown in FIG. 1B) that is very deep and bowing, wherein the manufacturing processes described for FIGS. 2 through 8 were used to form the layers 110, 112, and 114 of the capacitor and the cap layer 120, and Equation 1 was used to optimize and improve the cap layer 120 formation, by optimizing variables w, a, b, and c.

Capacitors 130 may be formed in other shapes of trenches, using other equations for optimizing the structures, in accordance with embodiments. For example, in FIG. 10, a trench 104" (e.g., comprising a trench 104" shown in FIG. 1C) is shown that has sidewalls that are substantially straight in a vertical direction within the workpiece 102. The capacitor material stack comprising the bottom electrode 110, dielectric layer 112, and the top electrode 114, and the cap layer 120 have been formed over the trench 104" as described for FIGS. 2 through 8. However, with this shape of trench 104" and a substantially conformal deposition process for the cap layer 120, in accordance with an embodiment of the present disclosure, at least one of (e.g., one or more of) the width w of the trench 104", the thickness a of the bottom electrode 110, the thickness b of the dielectric layer 112, the thickness c of the top electrode 114, and the thickness d of the cap layer 120 may be optimized using Equation 2:

$$w>2\times(a+b+c+d). \qquad \text{Eq. 2}$$

In this embodiment, the thickness of the cap layer 120 may be further optimized using Equation 3 and Equation 4:

$$d \geq d' > (0.2 \times d); \text{ and} \qquad \text{Eq. 3}$$

$$d \geq d'' > (0.2 \times d); \qquad \text{Eq. 4}$$

wherein d' comprises a thickness of the cap layer 120 on sidewalls of the trench 104" over the top electrode 114 material, and wherein d" comprises a thickness of the cap layer 120 on a bottom surface of the trench 104" over the top electrode 114 material.

Figure 11:
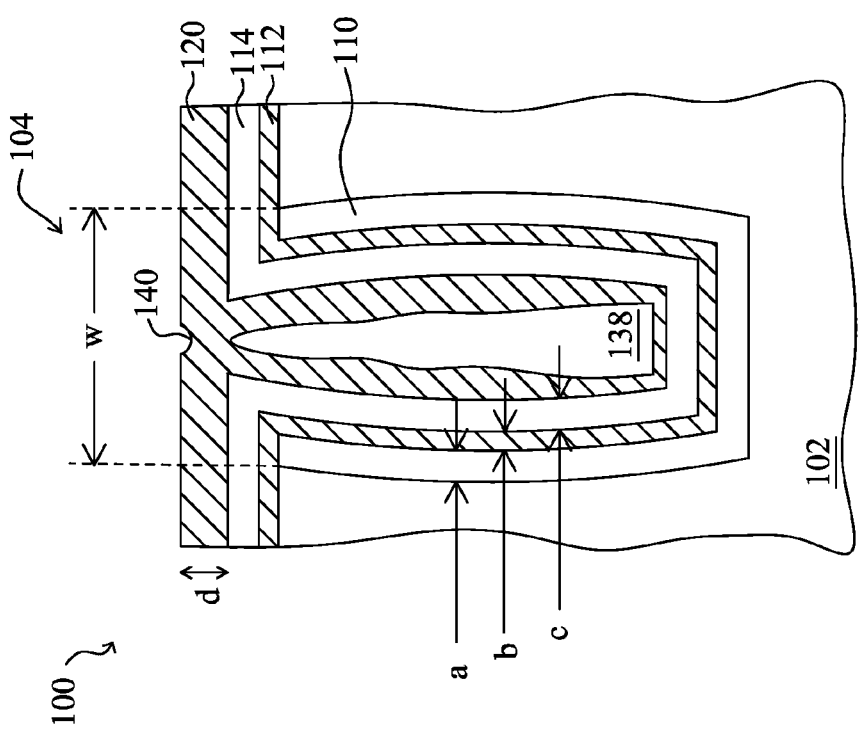
FIGS. 11 and 12 illustrate cross-sectional views of embodiments wherein the trench is bowed and a void is formed within the trench under a cap layer.
Figure 12:
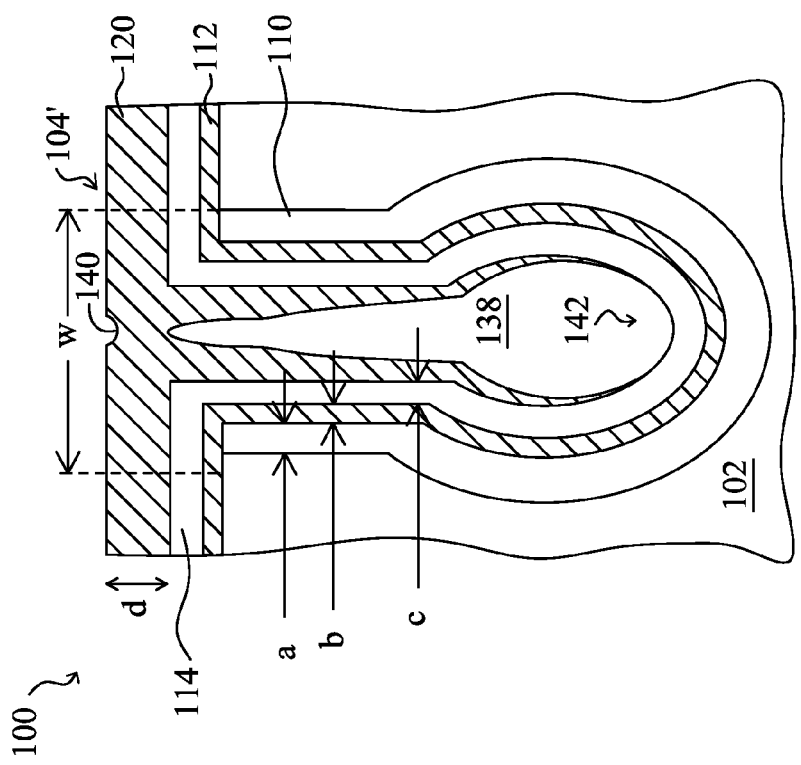

In other embodiments, if a trench 104 or 104' is very deep and has a little bowing or a large amount of bowing, and if forming the cap layer 120 comprises a non-conformal deposition process, at least one of the width w of the trench 104 or 104', the thickness a of the bottom electrode 110, the thickness b of the dielectric layer 112, the thickness c of the top electrode 114, and the thickness d of the cap layer 120 may be optimized using Equation 5:

$$w<2\times(a+b+c+d), \qquad \text{Eq. 5}$$

forming the structures shown in FIGS. 11 and 12. A void 138 may form in a lower portion of the trench 104 or 104' during the formation of the cap layer 120, due to the non-conformal deposition process and/or the narrowness of the trench 104 or 104'. The cap layer 120 completely covers the trench 104 and 104', encapsulating the void 138 and protecting the lower part of the trench 104 or 104', e.g., the top electrode 114 material from subsequent processing steps. The cap layer 120 may be thinner over the bottom of the trench 104, or may not cover the bottom of the trench 104', as shown at 142. The thinner cap layer 120 or lack of a cap layer 120 material on the bottom of the trench 104 or 104' is not problematic, because the cap layer 120 meets at the top of the trench 104 or 104', forming a continuous cap layer 120 that is formed completely over the trench 104 or 104'.

A slight recess 140 (e.g., comprising a depth of a few nm) may optionally form in the cap layer 120 over the trench 104 or 104', as shown. The recess 140 is negligible and has a low step height and thus is also not problematic.

After the cap layers 120 are formed over the top electrode 114 material in FIGS. 9, 10, 11, and 12, the cap layer 120, the top electrode 114 material, and the dielectric layer 112 are patterned as described with reference to FIG. 8 to form a capacitor 130 within the trenches 104, 104' and 104". Advantageously, because the cap layer 120 is optimized using the equations 1 through 5 described herein, the cap layer 120 completely covers the top electrode 114 and is continuous over the trenches 104, 104' and 104". The step coverage of the cap layer 120 over the top electrode 114 is improved, e.g., so that no large differences in height of a topography of the top surfaces of the cap layer 120 are formed across the surface of the workpiece 102, which may be advantageous for subsequent processing steps in some applications.

Figure 13:
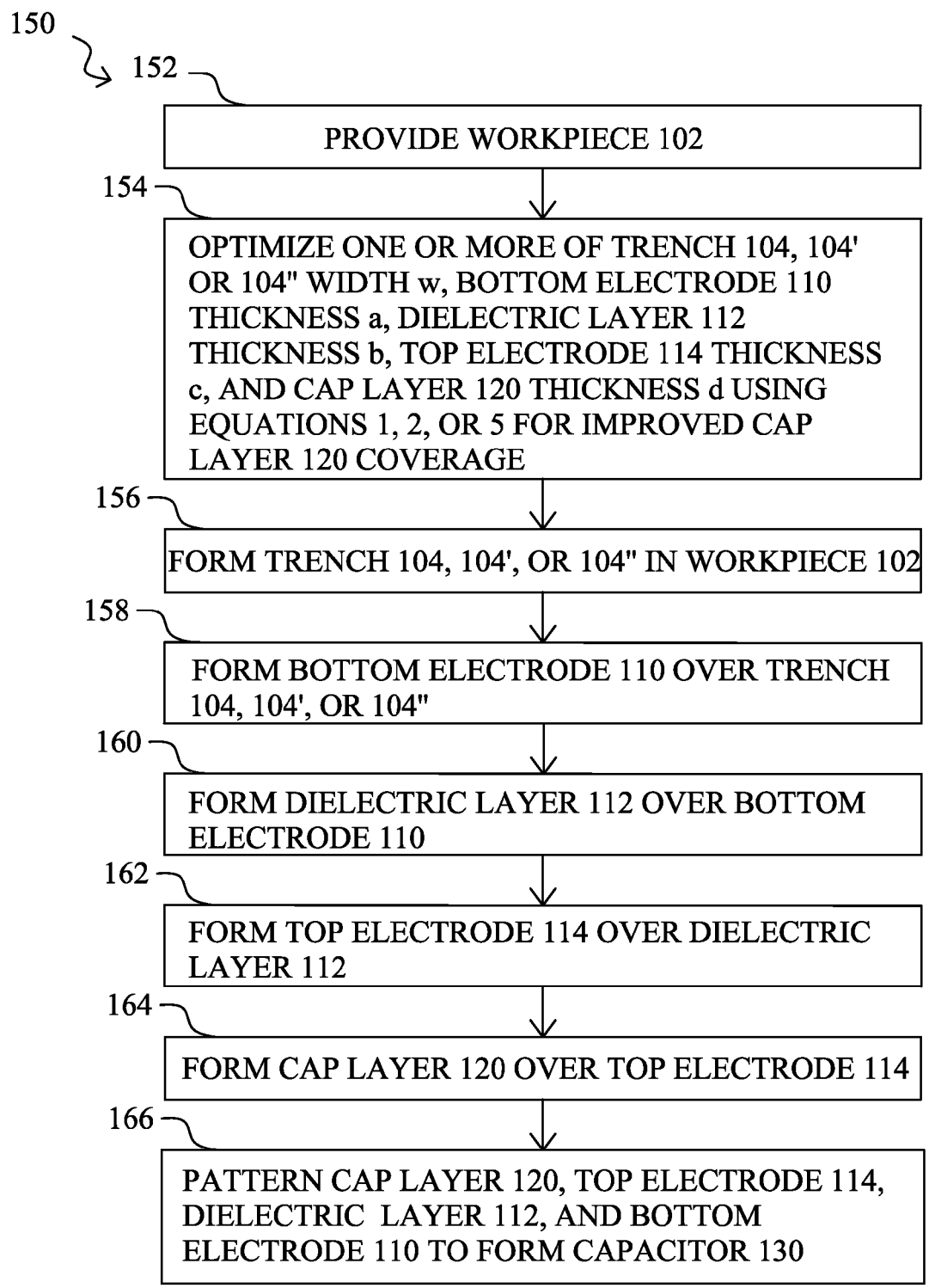
FIG. 13 is a flow chart showing a method of manufacturing a capacitor of a semiconductor device in accordance with an embodiment of the present disclosure.

FIG. 13 is a flow chart 150 showing a method of manufacturing a capacitor 130 of a semiconductor device 100 in accordance with an embodiment of the present disclosure. The workpiece 102 is provided (step 152). The method includes optimizing one or more of: a trench 104, 104', 104" width w, a bottom electrode 110 thickness a, a dielectric layer 112 thickness b, a top electrode 114 thickness c, and a cap layer 120 thickness d using equations 1, 2, or 5 described herein, to achieve improved cap layer 120 coverage (step 154). The trench 104, 104' or 104" is formed in the workpiece 102 (step 156), and a bottom electrode 110 is formed over the trench 104, 104', or 104" (step 158). A dielectric layer 112 is formed over the bottom electrode 110 (step 160), and a top electrode 114 material is formed over the dielectric layer 112 (step 162). A cap layer 120 is formed over the top electrode 114 (step 164). The cap layer 120, the top electrode 114 material, the dielectric layer 112, and the bottom electrode 110 are then patterned to form a capacitor 130 (step 166).

Advantages of embodiments of the disclosure include providing novel design methods, manufacturing processes, and structures for capacitors 130 of semiconductor devices 100, wherein the cap layer 120 coverage is improved. A more uniform step coverage of the cap layer 120 is attained using the novel methods described herein. Damage to the top electrode 114 and dielectric layer 112 of the capacitor 130 from subsequent manufacturing processing steps is prevented, due to the improved coverage of the cap layer 120, resulting in increased yields and improved reliability. For example, the removal of the photoresist 122 may comprise a plasma strip process, which may penetrate through the top electrode 114 and damage the high k dielectric material of the dielectric layer 112, if not for the presence of the cap layer 120 with improved coverage described herein.

In accordance with one embodiment of the present disclosure, a method of manufacturing a semiconductor device includes forming a capacitor within a trench in a workpiece, the capacitor comprising a bottom electrode, a dielectric layer disposed over the bottom electrode, and a top electrode disposed over the dielectric layer. A cap layer is formed over the capacitor. Forming the capacitor and forming the cap layer comprise optimizing at least one of: a width of the trench, a thickness of the bottom electrode, a thickness of the dielectric layer, a thickness of the top electrode, and a thickness of the cap layer so that the cap layer completely covers the top electrode. The optimizing of the at least one of the width of the trench, the thickness of the bottom electrode, the thickness of the dielectric layer, the thickness of the top electrode, and/or the thickness of the cap layer comprises using Equation 1 or Equation 2:

$$w < 2 \times (a+b+c); \text{ or} \qquad \text{Eq. 1}$$

$$w > 2 \times (a+b+c+d); \qquad \text{Eq. 2}$$

wherein w is the width of the trench, a is the thickness of the bottom electrode, b is the thickness of the dielectric layer, c is the thickness of the top electrode, and d is the thickness of the cap layer.

In accordance with another embodiment, a method of manufacturing a semiconductor device includes providing a workpiece, forming a trench in the workpiece, and forming a bottom electrode over the trench. The method includes forming a dielectric layer over the bottom electrode, forming a top electrode over the dielectric layer, and forming a cap layer over the top electrode. The top electrode, the dielectric layer, and the bottom electrode comprise a capacitor. At least one of a width of the trench, a thickness of the bottom electrode, a thickness of the dielectric layer, a thickness of the top electrode, and a thickness of the cap layer are optimized so that the cap layer completely covers the top electrode, using Equation 1, Equation 2, or Equation 5:

$$w < 2 \times (a+b+c); \qquad \text{Eq. 1}$$

$$w > 2 \times (a+b+c+d); \text{ or} \qquad \text{Eq. 2}$$

$$w < 2 \times (a+b+c+d); \qquad \text{Eq. 5}$$

wherein w is the width of the trench, a is the thickness of the bottom electrode, b is the thickness of the dielectric layer, c is the thickness of the top electrode, and d is the thickness of the cap layer.

In accordance with yet another embodiment, a semiconductor device includes a workpiece, and a capacitor disposed within a trench in the workpiece. The capacitor includes a bottom electrode, a dielectric layer disposed over the bottom electrode, and a top electrode disposed over the dielectric layer. A cap layer is disposed over the top electrode. A width of the trench, a thickness of the bottom electrode, a thickness of the dielectric layer, a thickness of the top electrode, and a thickness of the cap layer achieve Equation 1 or Equation 2:

$$w < 2 \times (a+b+c); \text{ or} \qquad \text{Eq. 1}$$

$$w > 2 \times (a+b+c+d); \qquad \text{Eq. 2}$$

wherein w is the width of the trench, a is the thickness of the bottom electrode, b is the thickness of the dielectric layer, c is the thickness of the top electrode, and d is the thickness of the cap layer.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of manufacturing a semiconductor device, the method comprising:
providing a workpiece;
forming a trench in the workpiece;
forming a bottom electrode over the trench;
forming a dielectric layer over the workpiece and the bottom electrode, wherein top portions of the bottom electrode on sidewalls of the trench are substantially co-planar with a top surface of the workpiece when the dielectric layer is formed over the workpiece;
forming a top electrode layer over the dielectric layer;
forming a cap layer over the top electrode layer, wherein the cap layer comprises a dielectric material, and wherein at least one of a width of the trench, a thickness of the bottom electrode, a thickness of the dielectric layer, a thickness of the top electrode layer, and a thickness of the cap layer is optimized so that the cap layer completely covers the top electrode layer, using Equation 1, Equation 2, or Equation 5:

$$w<2\times(a+b+c); \quad \text{Eq. 1}$$

$$w>2\times(a+b+c+d); \text{ or} \quad \text{Eq. 2}$$

$$w<2\times(a+b+c+d); \quad \text{Eq. 5}$$

wherein w is the width of an opening of the trench proximate the top surface of the workpiece, a is the thickness of the bottom electrode, b is the thickness of the dielectric layer, c is the thickness of the top electrode layer, and d is the thickness of the cap layer; and
patterning the cap layer, the top electrode layer, and the dielectric layer using a photoresist mask, wherein the patterned top electrode layer, the patterned dielectric layer, and the bottom electrode form a capacitor.

2. The method according to claim 1, wherein the at least one of the width of the trench, the thickness of the bottom electrode, the thickness of the dielectric layer, and the thickness of the top electrode layer is optimized using Equation 1.

3. The method according to claim 2, wherein the top electrode layer substantially fills an inner region of the trench.

4. The method according to claim 2, wherein the trench bows outwardly beneath the opening of the trench.

5. The method according to claim 2, wherein forming the cap layer comprises a non-conformal deposition process.

6. The method according to claim 1, wherein the at least one of the width of the trench, the thickness of the bottom electrode, the thickness of the dielectric layer, the thickness of the top electrode layer, and the thickness of the cap layer is optimized using Equation 2.

7. The method according to claim 6, further comprising optimizing the thickness of the cap layer using Equation 3 and Equation 4:

$$d \geq d' > (0.2 \times d); \text{ and} \quad \text{Eq. 3}$$

$$d \geq d'' > (0.2 \times d); \quad \text{Eq. 4}$$

wherein d' comprises a thickness of the cap layer on the sidewalls of the trench over the top electrode layer, and wherein d" comprises a thickness of the cap layer on a bottom surface of the trench over the top electrode layer.

8. The method according to claim 6, wherein the sidewalls of the trench are substantially straight in a vertical direction within the workpiece.

9. The method according to claim 6, wherein forming the cap layer comprises a substantially conformal deposition process.

10. The method according to claim 1, wherein the at least one of the width of the trench, the thickness of the bottom electrode, the thickness of the dielectric layer, the thickness of the top electrode layer, and the thickness of the cap layer is optimized using Equation 5.

11. The method according to claim 10, wherein the trench bows outwardly beneath the opening of the trench.

12. The method according to claim 10, wherein forming the cap layer comprises a non-conformal deposition process.

13. The method according to claim 10, wherein the cap layer is continuous over the trench, and wherein forming the cap layer forms a void within the trench beneath the cap layer.

14. The method according to claim 1, wherein optimizing the at least one of the width of the trench, the thickness of the bottom electrode, the thickness of the dielectric layer, the thickness of the top electrode layer, and the thickness of the cap layer improves a step coverage of the cap layer over the top electrode layer.

15. A method of manufacturing a semiconductor device, the method comprising:
providing a workpiece;
forming a trench in the workpiece;
forming a bottom electrode on sidewalls and a bottom surface of the trench;
forming a dielectric layer over the workpiece, wherein top portions of the bottom electrode on the sidewalls of the trench are substantially co-planar with a top surface of the workpiece when the dielectric layer is formed over the workpiece;
forming a top electrode layer over the dielectric layer;
forming a cap layer over the top electrode layer;
patterning the cap layer, the top electrode layer, and the dielectric layer, wherein the patterned top electrode layer, the patterned dielectric layer and the bottom electrode comprise a capacitor, and wherein the patterning comprises:
depositing a photoresist layer over the cap layer;
patterning the photoresist layer; and
using the patterned photoresist layer as a mask to etch unmasked portions of the cap layer, the top electrode layer, and the dielectric layer; and
removing the photoresist layer, wherein the cap layer protects the top electrode layer and the dielectric layer during the removing step,
wherein at least one of a width of the trench, a thickness of the bottom electrode, a thickness of the dielectric layer, a thickness of the top electrode layer, and a thickness of the cap layer is optimized so that the cap layer completely covers the top electrode layer, wherein the optimizing comprises using Equation 1 or Equation 2:

$$w<2\times(a+b+c); \text{ or} \quad \text{Eq. 1}$$

$$w>2\times(a+b+c+d), \quad \text{Eq. 2}$$

wherein w is the width of an opening of the trench proximate the top surface of the workpiece, a is the thickness of the bottom electrode, b is the thickness of the dielectric layer, c is the thickness of the top electrode layer, and d is the thickness of the cap layer.

16. A method of manufacturing a semiconductor device, the method comprising:
providing a workpiece;
forming a trench in the workpiece;
forming a bottom electrode over the trench;

forming a dielectric layer over the workpiece and the bottom electrode, wherein top portions of the bottom electrode on sidewalls of the trench are substantially coplanar with a top surface of the workpiece when the dielectric layer is formed over the workpiece;

forming a top electrode layer over the dielectric layer;

forming a cap layer over the top electrode layer, wherein at least one of a width of the trench, a thickness of the bottom electrode, a thickness of the dielectric layer, a thickness of the top electrode layer, and a thickness of the cap layer is optimized so that the cap layer completely covers the top electrode layer, using Equation 1 or Equation 5:

$$w < 2 \times (a+b+c); \text{ or} \qquad \text{Eq. 1}$$

$$w < 2 \times (a+b+c+d); \qquad \text{Eq. 5}$$

wherein w is the width of an opening of the trench proximate the top surface of the workpiece, a is the thickness of the bottom electrode, b is the thickness of the dielectric layer, c is the thickness of the top electrode layer, and d is the thickness of the cap layer; and patterning the cap layer, the top electrode layer, and the dielectric layer using a photoresist mask, wherein the patterned top electrode layer, the patterned dielectric layer, and the bottom electrode form a capacitor.

17. The method according to claim 16, wherein forming the cap layer comprises a non-conformal deposition process.

18. The method according to claim 16, wherein the cap layer comprises SiON, $SiO_2$, or $Si_xN_y$.

19. The method according to claim 16, wherein the cap layer comprises an anti-reflective coating material.

20. The method according to claim 16, further comprising removing the photoresist mask using a plasma strip process, wherein the cap layer protects the top electrode layer and the dielectric layer during the removing.

* * * * *